United States Patent [19]

Johnson

[11] Patent Number: 5,473,110
[45] Date of Patent: Dec. 5, 1995

[54] MAGNETICALLY-ATTACHABLE EMI SHIELDING COVER FOR ATTENUATING ELECTROMAGNETIC EMANATION

[75] Inventor: Duane C. Johnson, White Bear Lake, Minn.

[73] Assignee: Unisys Corporation, Blue Bell, Pa.

[21] Appl. No.: 400,063

[22] Filed: Mar. 7, 1995

[51] Int. Cl.$^6$ ................................................ H05K 9/00
[52] U.S. Cl. ................................ 174/35 GC; 361/818
[58] Field of Search ........................ 174/35 R, 35 GC, 174/35 MS; 361/799, 800, 816, 818; 24/303; 250/505.1, 506.1, 515.1

[56] References Cited

U.S. PATENT DOCUMENTS

| | | | |
|---|---|---|---|
| 3,969,572 | 7/1976 | Rostek | 174/35 MS |
| 4,037,009 | 7/1977 | Severinsen | 174/350 X |
| 4,218,507 | 8/1980 | Deffeyes et al. | 428/328 |
| 4,293,741 | 10/1981 | Digre | 381/199 |
| 4,408,255 | 10/1983 | Adkins | 361/382 |
| 4,678,699 | 7/1987 | Kritchevsky et al. | 428/175 |
| 4,700,436 | 10/1987 | Morita | 24/303 |
| 4,779,314 | 10/1988 | Aoui | 24/303 |
| 4,825,090 | 4/1989 | Grabis | 250/515.1 |
| 5,028,739 | 7/1991 | Keyser et al. | 174/35 GC |
| 5,041,945 | 8/1991 | Suzuni | 361/818 |
| 5,105,056 | 4/1992 | Hoge et al. | 174/35 GC |
| 5,117,065 | 5/1992 | Savage et al. | 174/35 MS |
| 5,194,691 | 3/1993 | McIlwraith | 174/35 GC |
| 5,239,125 | 8/1993 | Savage et al. | 174/35 MS |
| 5,250,342 | 10/1993 | Lang et al. | 428/138 |
| 5,253,394 | 10/1993 | Morita | 24/303 |

Primary Examiner—Morris H. Nimmo
Assistant Examiner—Christopher Horgan
Attorney, Agent, or Firm—Charles A. Johnson; Mark T. Starr

[57] ABSTRACT

A surface-compliant, removable and reusable EMI shielding cover for attenuating EMI emanation from openings in a shielding structure. An electrically conductive sheet or web is held over an opening in the shielding structure by an associated magnetic sheet, which is attracted to the metal shielding structure. The electrically conductive sheet or web, and the magnetic sheet are made of flexible material so that physical protrusions or non-planar surfaces on the shielding structure do not prevent the resulting EMI shielding cover from making complete contact around the periphery of an opening which is to be shielded. The conductive sheet and magnetic sheet can be made into a single composite EMI shield by applying an adhesive layer between the conductive sheet and the magnetic sheet.

22 Claims, 4 Drawing Sheets

MAGNETICALLY-ATTACHABLE EMI SHIELDING COVER FOR ATTENUATING ELECTROMAGNETIC EMANATION

BACKGROUND OF THE INVENTION

1. Field of the Invention

This invention relates to the shielding of electromagnetic and radio frequency waves, and more particularly to removable shielding apparatus for at least temporarily covering holes, apertures, or other openings in electronic equipment, such removable shielding apparatus being reusable.

2. Description of the Prior Art

Electronic equipment can emit a variety of electromagnetic waves that may cause interference with other unrelated equipment, such as radio, television or computer equipment. Electromagnetic interference (EMI), which includes radio frequency interference (RFI), can originate from computer equipment, or from associated power supplies, and can emanate from signal-transmitting wires and their connections. To contain EMI, electronic equipment manufacturers utilize cabinets made of electrically conductive materials arranged to totally encase all circuitry that can cause unwanted electromagnetic radiation. To comply with good design practice and to comply with governmental regulation, it is necessary to minimize electromagnetic radiation.

EMI considerations have become increasingly important partly because of the increased signal frequency operation of electronics devices. As the signal transition rate of electronic circuitry increases, so increases electromagnetic radiation. EMI shielding techniques are used to retain EMI within the operational device to thereby protect other equipment from interference generated in the shielded equipment, and also to protect the shielded equipment from external EMI sources. Shielding protects equipment from damage or improper operation (e.g., inadvertent triggering or switching of electronic circuits) due to current induction caused by the electromagnetic field. Governmental regulations and industry standards require that EMI and RFI sources within a system be shielded so that any unwanted EMI or RFI discharge will be maintained within regulation limits.

EMI gaskets, for sealing cabinet doors or other adjoining cabinet sections, and EMI covers, for covering cabinet openings, have been used across the path of EMI radiation to contain the electromagnetic emanation. These gaskets or covers are electrically conductive, and are designed to make electrical contact with the electronic equipment, or more particularly, to the equipment housing. The electromagnetic radiation that would normally pass through a hole or other aperture will be reflected back into the equipment housing to be dissipated in the resistive elements of the circuitry, and thus is prevented from escaping the enclosure.

Methods of coveting openings in electronic equipment have involved permanent affixation or adhesives. A permanent fix could include screwing or riveting a conductive cover over the opening. Such fixes may be effective in reducing EMI emanation, however it requires the drilling of more holes in the enclosure, which takes time, and the new screw or rivet holes can potentially become new sources of EMI leaks. A conductive cover could also be welded over the opening. Such covers are meant to be permanent, and are not readily removed. It may be the case that the opening in the enclosure is an intentional opening designed to allow for future expansion. For instance, an opening may be supplied in a computer cabinet to allow for cable connection to optional external peripheral devices. A permanent fix such as a riveted cover would be undesirable where there is a potential of using the opening at a future time.

Adhesives can be used to secure an EMI shield over an opening but adhesives can pose problems. First, an adhesive may exhibit the same undesirable effects as a permanently affixed cover if the adhesive can not be easily removed if so desired. Also, an adhesive can reduce the effectiveness of the electrical connection between the conductive material and the housing. To avoid this problem, conductive adhesives have been devised wherein a non-conductive material was made conductive by introducing conductive particles into the non-conductive material. Again, this method may result in a near-permanent cover, and the process of applying the conductive adhesive is time-consuming. Furthermore, conductive adhesives tend to break down over time.

The present invention avoids the aforementioned problems by providing an inexpensive, flexible, surface-conforming and removable shielding cover. This shielding cover is easily attached to a metal shielding cabinet through the use of a magnetic component that will cooperate with the cabinet and/or time structure to hold the cover in place. No drilling, riveting, screwing, or gluing is required. This attachment method allows the cover to be easily removed when the underlying opening is to be used. Such a cover has proved to be very beneficial in systems capable of future expansion, where openings are provided for switches, connectors, cables, or other components which are not used in a particular system configuration. The Magnetically-Attachable EMI Shielding Cover can be placed over these openings to attenuate EMI emanation, and when the opening is to be used, the cover can be easily removed, leaving no rivet holes, screw holes, or glue remnants.

The Magnetically-Attachable EMI Shielding Cover can be easily cut to a particular size for proper fitting over an opening, and also to allow the shielding cover to be fit into less accessible places than that of other shielding covers. The ability to cut the Magnetically-Attachable EMI Shielding Cover to size can also minimize manufacturing and packaging costs, since a standard size can be manufactured, and the user simply cuts out a cover of the desired size and shape.

Another advantage of the present invention is its low cost. The shielding cover is constructed of low cost materials which are easily obtainable. Actual construction of the cover is very inexpensive, as there are very few construction steps required.

Methods have been developed for attenuating EMI emanation from shielding enclosures. One such method is disclosed in U.S. Pat. No. 5,239,125 by Savage et al., issued on Aug. 24, 1993. Disclosed therein is an EMI shield for shielding junctions and cracks of EMI protected structures, which also maintains electrical continuity in corners, joints, and areas of anticipated cracking or delamination. The EMI shield disclosed by Savage et al. comprises a porous screen positioned over the crack, joint, comer, etc., upon which an overcoat of metal is deposited on and through the screen such that the screen is bonded to the underlying surface. Such a method appears to permanently bond the screen to the underlying surface. The advantage of the present invention over the Savage et al. design is the ability to easily move, or remove, the shield at any time, and particularly when the underlying aperture has a future potential use. The Savage et al. disclosure also appears to fortify seams and other discontinuities having a relatively small aperture, since the metal overcoat is deposited on and through the screen such that the screen is bonded "to the underlying surface".

The present invention can reflect EMI radiation regardless of the size of the aperture.

U.S. Pat. No. 4,408,255 by Adkins, issued on Oct. 4, 1983, discloses a method of reducing the EMI effects generated by printed circuit boards by using magnetically permeable materials to absorb EMI radiation. The magnetic material is used in a different manner, and for a different purpose, than in the present invention. In Adkins, the magnetic material is used to absorb the EMI radiation, whereas the present invention uses the magnetic material as a securing component to hold an EMI-reflective component over an EMI-emanating aperture.

Another arrangement utilizing a magnetic attachment material is disclosed in U.S. Pat. No. 3,969,572 by Rostek, issued on Jul. 13, 1976. Rostek discloses an EMI gasket for use in sealing discontinuities in shielded cabinets, such as door openings. The elongated gasket is formed by spirally wrapping a conductive metal around juxtaposed strips of plastic foam and flexible plastic permanent magnets. The magnetic gasket holds one portion of the cabinet against another. The cabinet portions perform the shielding, and the gasket electrically seals the seams between the cabinet portions. This differs from the present invention where the material is an EMI cover, and not a gasket. The present invention performs the EMI shielding function, whereas the Rostek disclosure seals gaps between cabinet components that are coveting EMI radiation. The EMI shield of the present invention can be cut to a desired size, and can conform to the surface of the cabinet due to it's relative flexibility. This allows a cabinet opening to be immediately shielded, without the need for modifying the cabinet itself. The flexible and pliable characteristics of present invention allows cabinet openings to be covered where the openings have rough or burred edges, and even where the openings are on a non-planar surface of the cabinet. In Rostek, the EMI shielding device does not cover openings itself, but rather seals gaps created by juxtaposed cabinet components. Therefore, the Rostek device does not have the desired quality of immediate repair of openings without cabinet modification, or of shielding openings on non-planar surfaces. Furthermore, the Rostek disclosure teaches a gasket strip which is bonded to one portion of the cabinet, rather than being completely removable as in the present invention. This bonding appears to be accomplished through the use of a conductive adhesive. The EMI shield of the present invention requires no conductive adhesives, since the conductive component is held directly against the cabinet by using a magnetic attraction device.

In summary, the present invention avoids the problems encountered in many other types of EMI covers. Problems associated with adhesives, permanent affixation, installation time, and expense can be overcome through the use of the present invention. The device can be used as a permanent EMI-reduction device, or it can be used during system testing in the early stages of a product development cycle. It is particularly advantageous during the early development stages, since cabinet openings may exist due to undeveloped external devices, and it would be undesirable to permanently affix EMI covers over these openings when they will be used in later stages of the development cycle. For the foregoing reasons, the present invention can prove to be a very desirable EMI-reduction device.

OBJECTS

It is a primary objective of this invention to provide an improved EMI shielding cover.

It is another object of the present invention to provide a cost-effective method for attenuating electromagnetic interference emanation from openings in electronic shielding structures.

It is yet another object of the present invention to provide an EMI shielding cover that can be easily applied and removed.

A further object of this invention is to provide a layer or web of electrically conductive material that works in cooperation with a flexible magnetic layer to act as an improved EMI shielding cover.

It is still another object to provide an EMI shielding cover that is not permanently affixed to the electronic shielding structure, so that the underlying opening or aperture can be utilized at a future time.

Another object of the present invention is to provide an EMI shielding cover that is attached to a shielding structure through magnetic attraction.

Yet another object of the invention to provide an EMI shielding cover that can be applied and utilized without the need for external components or tools.

It is another object to provide an EMI shielding cover that is reusable without quality deterioration.

Another object of the invention is to provide a flexible and surface-compliant EMI shielding cover to allow an opening to be completely covered despite physical abnormalities on the surface of the shielding structure, or despite non-planar characteristics of the shielding structure.

It is yet a further object to provide an EMI shielding cover that can be easily manufactured.

Yet another object of the present invention is to provide an EMI shielding cover that can be quickly and easily cut to the proper desired size.

Other more detailed objectives will become apparent from a consideration of the Drawings and the Detailed Description of the Preferred Embodiment.

SUMMARY OF THE INVENTION

The Magnetically-Attachable EMI Shielding Cover For Attenuating Electromagnetic Emanation provides a cost-effective, easily-manufactured, removable, and modifiable method of attenuating EMI emanation from shielded cabinet openings. It is most beneficial for use in an electronic system that is enclosed by an EMI shielding structure, wherein the shielding structure has apertures or openings allowing EMI release.

In one embodiment of the present invention, an electrically conductive sheet is applied to a shielding structure over an opening. The conductive sheet essentially prevents electromagnetic waves from emanating from the opening. A magnetic sheet is applied to the shielding structure over the conductive sheet to hold the conductive sheet over the opening. The conductive sheet and the magnetic sheet can be made of flexible material so that physical protrusions on the shielding structure do not prevent the conductive sheet and the magnetic sheet from making complete contact around the periphery of the opening.

In another embodiment of the present invention, an adhesive is applied between the conductive sheet and the magnetic sheet to form a single composite EMI shielding cover. The conductive side of the composite EMI shielding cover is applied over an opening on the shielding structure, and the magnetic side is attracted through the conductive sheet to the metal shielding structure to hold the unit in place. The composite EMI Shielding Cover can be made of flexible materials to allow it to conform to the surface of the shielding structure, despite non-planar characteristics of the shielding structure. The composite EMI Shielding Cover can also be cut to any desired size or shape, in order to adequately cover the opening and thereby attenuate EMI emanation.

Still other objects and advantages of the present invention will become readily apparent to those skilled in this art from the following detailed description, where the preferred embodiment of the invention is shown by way of illustration of the best mode contemplated of carrying out the invention. As will be realized, the invention is capable of other and different embodiments, and its details are capable of modification without departing from the invention. Accordingly, the drawing and description are to be regarded as illustrative in nature, and not as restrictive.

DETAILED DESCRIPTION OF THE PREFERRED EMBODIMENT

Figure 1:
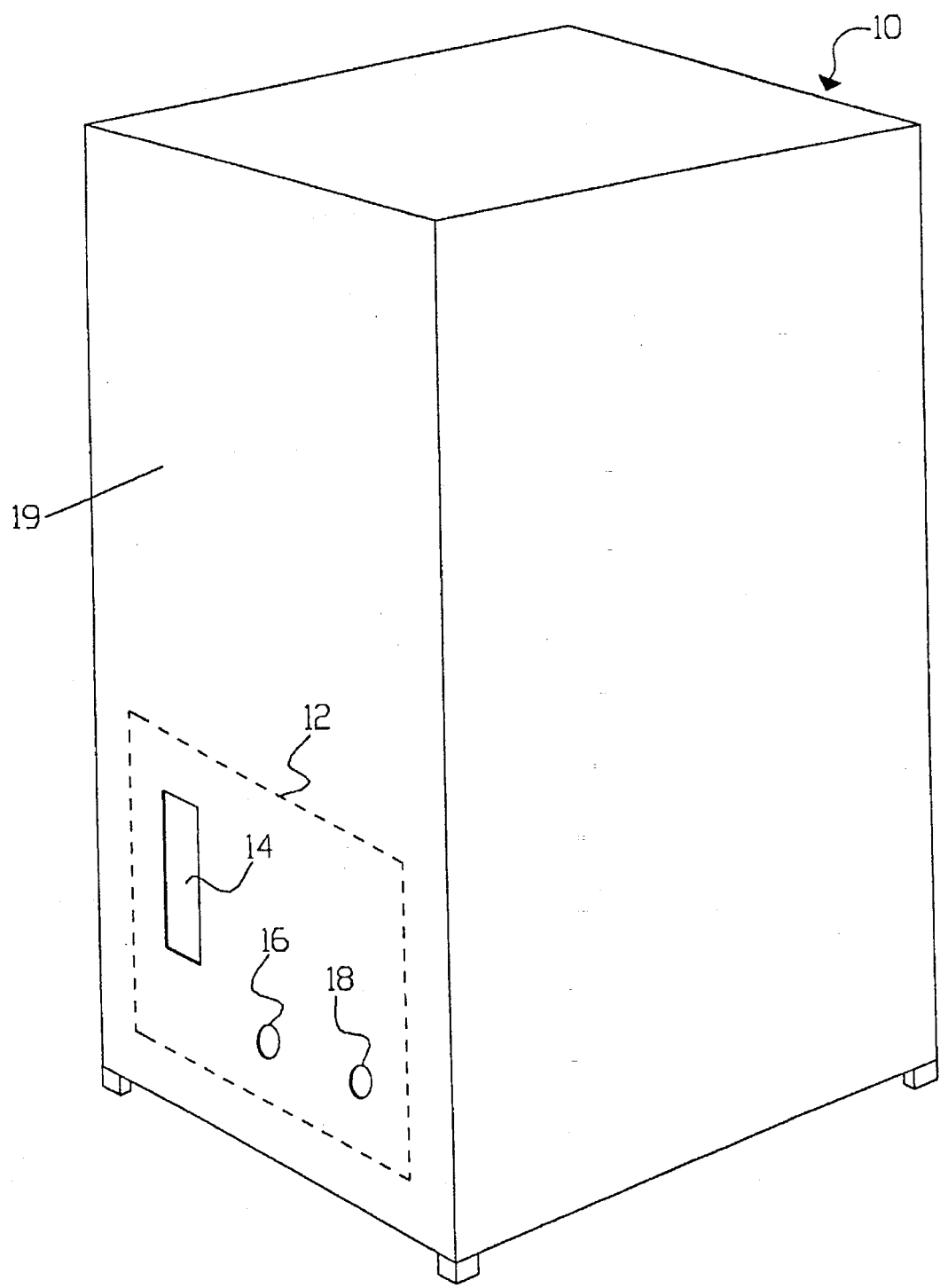
FIG. 1 is a diagram of a typical EMI shielded cabinet in which the present invention is utilized.

FIG. 1 is a diagram of a typical EMI shielded cabinet in which the present invention is utilized. The Shielded Cabinet 10 is made of a material capable of shielding electromagnetic emanation, and is only representative of the type of cabinet in which the present invention may be applied. At least a portion of the Shielded Cabinet 10 must be composed of ferro-magnetic material, so that electromagnetic shielding covers may be attached, as described in FIG. 2.

A cabinet, such as the Shielded Cabinet 10, may have openings, slots, or other types of apertures which provide means for wire cables and the like to be passed through it. Panel 12 shows an area of the Shielded Cabinet 10 including such apertures, as depicted by Slot 14, and Cable Openings 16 and 18. This arrangement is illustrative only, and various other types of apertures, openings, gaps, and other arrangements can exist. Cable Openings 16 and 18 may be used to allow wire cables (not shown) to be passed through Panel 12 of Wall 19 of the Shielded Cabinet 10 to be connected to an external device (not shown). Slot 14 represents an opening that might be used to allow a group of cables (not shown) to be passed through cabinet Wall 19. Slot 14 could also represent an area which is designed for future expansion to allow additional circuitry to be attached for an optional system configuration.

Such openings as are shown on Panel 12 may not be utilized in certain system configurations. For instance, the Shielded Cabinet 10 may house an instruction processor (not shown) which can be coupled to a second shielded cabinet (not shown) in a multi-processing system configuration. The Shielded Cabinet 10 must be designed so that this expansion capability exists, and this is accomplished by providing the openings as shown on Panel 12. However, there may be system configurations that do not require connection to external circuits, and in this case Slot 14 and Cable Openings 16 and 18 would be unused. In such cases, the unused openings will allow EMI radiation to be released from the Shielded Cabinet 10. Therefore, these openings must be covered when they are not being used.

Figure 2:
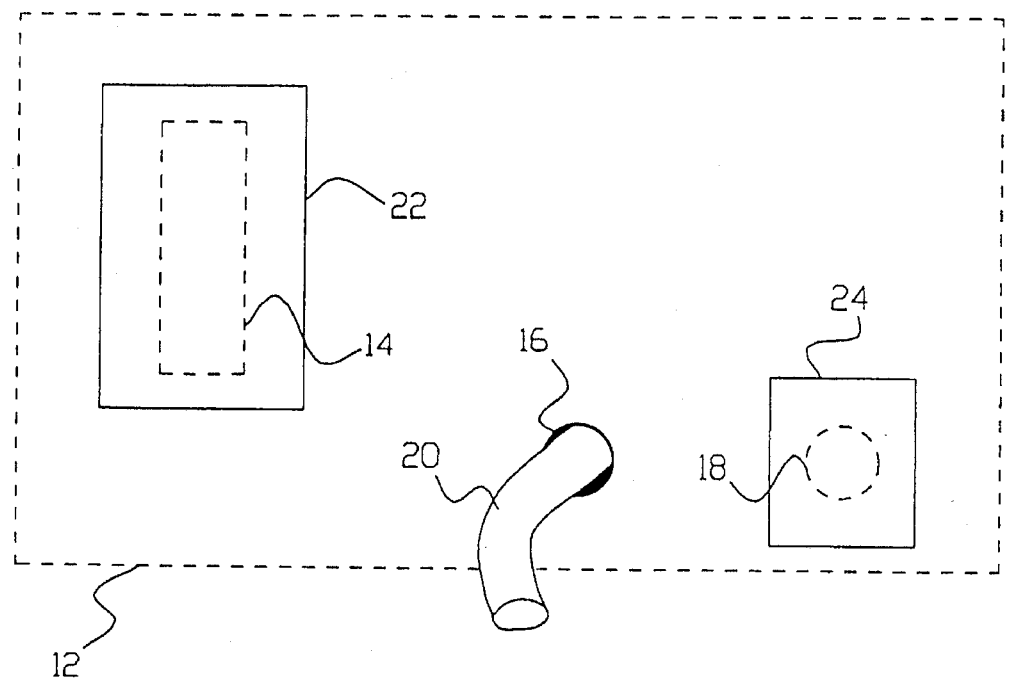
FIG. 2 is a diagram of the Panel and the role of the present invention.

FIG. 2 is a diagram of the Panel 12 and the role of the present invention. Cable Opening 16 on Panel 12 is shown as providing a means for allowing Cable 20 to pass outside Shielding Cabinet 10 to external circuitry. Cable Opening 16 requires EMI shielding around Cable 20, and such EMI shielding around Cable 20 is accomplished through the use of a shielded bushing (not shown) or other shielding device. However, Slot 14 and Cable Opening 18 are unused, and therefore these apertures must be covered in a way to prevent EM/from being released from the cabinet. The present invention provides this functionality. The Magnetically-Attachable EMI Shielding Covers 22 and 24 are shown in FIG. 2 as coveting the Slot 14 and the Cable Opening 18 respectively. The Slot 14 and Cable Opening 18 are shown as dashed lines to indicate that they are behind their associated Magnetically-Attachable EMI Shielding Covers 22 and 24. The Magnetically-Attachable EMI Shielding Covers 22 and 24 cover the openings, and provide a conductive path to transmit any EMI emanation to the Panel 12, and to reflect EMI emanation back into the Shielded Cabinet 10 in FIG. 1.

Figure 3:
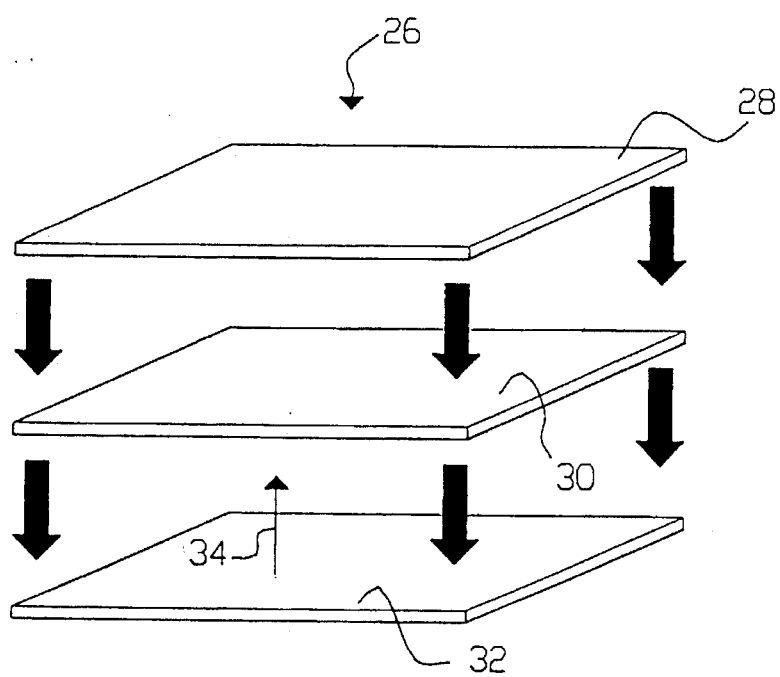
FIG. 3 is an exploded view of one embodiment of a Magnetically-Attachable EMI Shielding Cover.

FIG. 3 is an exploded view of one embodiment of a Magnetically-Attachable EMI Shielding Cover 26. The Magnetically-Attachable EMI Shielding Cover 26 comprises a Conductive Sheet 28, an Adhering Layer 30, and a Magnetic Base 32. The Conductive Sheet 28 can be in the form of a solid conductive layer, or it can be a conductive screen, web, or other perforated conductive layer. As seen in FIG. 3, the Conductive Sheet 28 is attached to the Magnetic Base 32 by the Adhering Layer 30. The Magnetic Base 32 is a magnetic layer of sufficient magnetic force to sufficiently hold the Conductive Sheet 28 in place against the Shielding Cabinet 10. In one embodiment of the invention, a sufficient magnetic force was obtained utilizing a flexible magnetic material having a thickness between 0.5 mm and 1 mm. The Magnetic Base 32 must be oriented so that the magnetic field attracts ferro-magnetic devices in the direction of Line 34.

The Conductive Sheet 28 is typically made of a very thin conductive material, such as a copper foil. The thickness of the copper foil used in one embodiment of the present invention is approximately 0.02 mm to 0.05 mm. Such a copper foil is manufactured by the 3M Corporation, and can be easily cut to the desired size. Another such conductive material is a conductive cloth, which is made by companies such as Schlegal and Chromerics. Other examples include a thin metal woven screen, metal mesh, or a thin knitted metal cloth as made by the Tecknit Corporation. These conductive materials are representative only, and the invention is not to be limited to these specified conductive materials. The Conductive Sheet 28 can also be deposited directly onto the Magnetic Base 32 by methods readily available in the art, such as vapor deposition, sputter deposition, painting, plating, or other deposition methods.

The Adhering Layer 30 attaches the Conductive Sheet 28 to the Magnetic Base 32. The Adhering Layer 30 can consist of any type of adhesive, glue or epoxy which will sufficiently hold the Conductive Sheet 28 to the Magnetic Base 32, while allowing the magnetic field from the Magnetic Base 32 to pass through the Conductive Sheet 28. Some copper foils and conductive cloth already provide an adhering material on one side of the conductor. In such cases, an additional Adhering Layer 30 is not required, since the Conductive Sheet 28 can be directly adhered to the Magnetic Base 32.

The Magnetic Base 32 is most beneficial if made of a flexible material. The Magnetic Base 32 of the preferred embodiment is made of a commercially available flexible magnetic material. The flexibility of the magnetic base allows the resulting Magnetically-Attachable EMI Shielding Cover 26 to cover openings on a surface that is not completely smooth or planar. For instance, where the Slot 14 was cut such that the edges were rough and extended outward from the planar surface of the Panel 12, a flexible Magnetically-Attachable EMI Shielding Cover 26 would conform to the Panel 12 despite the undesired protrusions (See FIG. 6). Furthermore, an opening such as Slot 14 could be on a curved or other non-planar surface of Shielding Cabinet 10, and a flexible Magnetically-Attachable EMI Shielding Cover 26 would be capable of conforming to such a curved or non-planar surface (See FIG. 7). Where a flexible Magnetic Base 32 is used, the Conductive Sheet 28 and Adhering layer 30 must also be flexible to obtain the benefit of a flexible Magnetically-Attachable EMI Shielding Cover 26.

Figure 4:
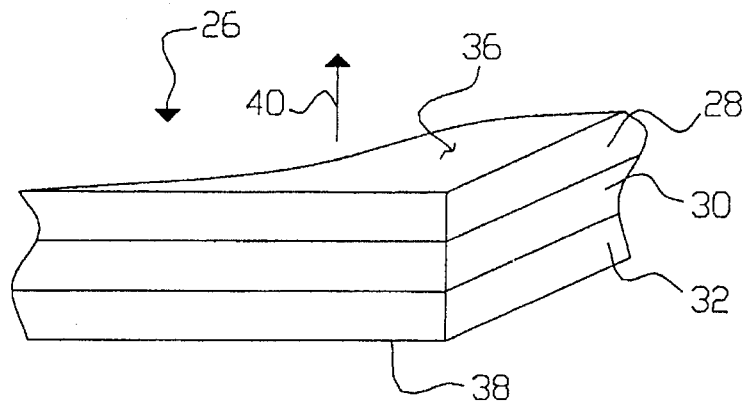
FIG. 4 is a partial sectional perspective view of the composite Magnetically-Attachable EMI Shielding Cover.

FIG. 4 is a partial sectional perspective view of the composite Magnetically-Attachable EMI Shielding Cover 26. The Adhering Layer 30 holds the Conductive Sheet 28 and the Magnetic Base 32 together to form a single composite unit, labeled the Magnetically-Attachable EMI Shielding Cover 26. The Magnetically-Attachable EMI Shielding Cover 26 has an electrically conductive side, labeled Side 36, and a magnetic side, labeled Side 38. The magnetic field causes the Magnetically-Attachable EMI Shielding Cover 26 to be attracted to ferromagnetic devices in the direction of Line 40.

Figure 5:
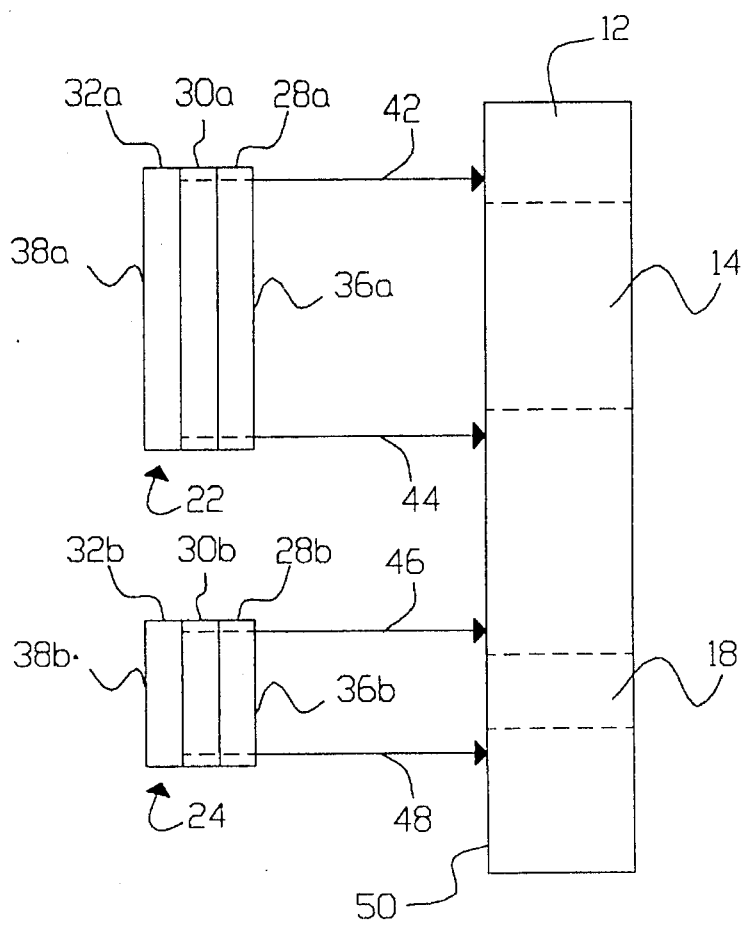
FIG. 5 is a diagram showing the application of the Magnetically-Attachable EMI Shielding Cover to the Panel of the Shielded Cabinet.

FIG. 5 is a diagram showing the application of the Magnetically-Attachable EMI Shielding Covers 22 and 24 to the Panel 12 of the Shielded Cabinet 10 (shown in FIG. 1). Slot 14 and Cable Opening 18 can be covered by Magnetically-Attachable EMI Shielding Covers 22 and 24 respectively to reduce EMI emanation. Magnetically-Attachable EMI Shielding Cover 22 consists of Conductive Sheet 28a, Adhering Layer 30a, and Magnetic Base 32a. Side 36a is compressed against the Panel 12 by Magnetic Base 32a in the direction of Lines 42 and 44. Similarly, Magnetically-Attachable EMI Shielding Cover 24 consists of Conductive Sheet 28b, Adhering Layer 30b, and Magnetic Base 32b. Side 36b is compressed against the Panel 12 by Magnetic Base 32b in the direction of Lines 46 and 48.

Magnetic Bases 32a and 32b hold Conductive Sheets 28a and 28b respectively against the outer Face 50 of the Panel 12. The Conductive Sheets and Magnetic Bases should completely cover the Slot 14 and Cable Opening 18 to properly attenuate EMI emanation. The Magnetically-Attachable EMI Shielding Covers 22 and 24 can be easily removed when coveting the Slot 14 or Cable Opening 18 is no longer necessary.

Figure 6:
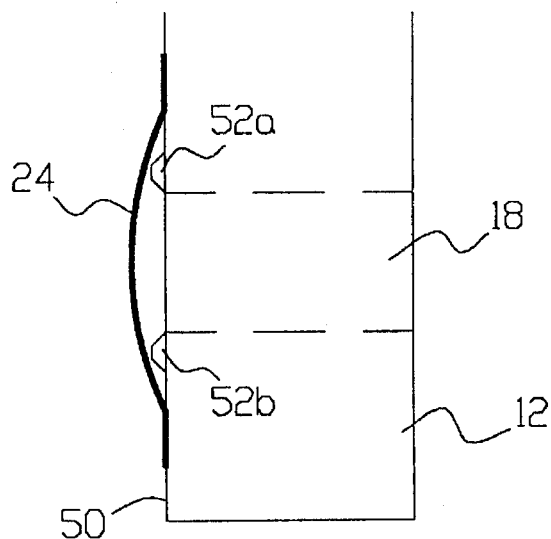
FIG. 6 depicts the ability of a flexible Magnetically-Attachable EMI Shielding Cover to cover openings despite surface anomalies.

FIG. 6 depicts the ability of the flexible Magnetically-Attachable EMI Shielding Cover 24 to cover openings despite surface anomalies. Viewing Panel 12 perpendicular to the longitudinal direction of Cable Opening 18, it can be seen that surface anomalies may be present around Cable Opening 18 as depicted by Surface Defects 52a and 52b. Such Surface Defects may be caused during the process of cutting Cable Opening 18 into Panel 12. Surface anomalies such as Surface Defect 52a and 52b may also be present due to a rough or irregular surface on Face 50 of Panel 12. The flexibility of the Magnetically-Attachable EMI Shielding Cover 24 allows it to conform around Surface Defects 52a and 52b, while allowing a substantial portion of the Magnetically-Attachable EMI Shielding Cover 24 to remain in contact with Face 50 of Panel 12.

Figure 7:
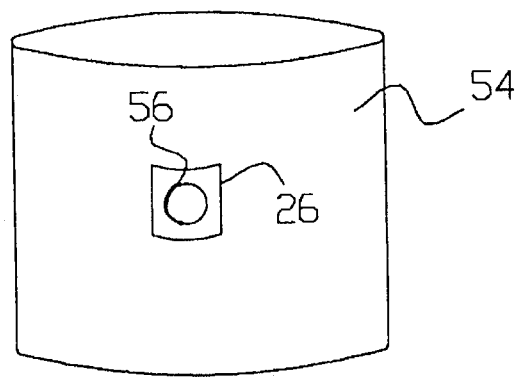
FIG. 7 depicts the manner in which a flexible Magnetically-Attachable EMI Shielding Cover can be used to cover openings on a curved or other non-planar surface.

FIG. 7 depicts the manner in which a flexible Magnetically-Attachable EMI Shielding Cover 26 can be used to cover openings on a curved or other non-planar surface. Shielding structures can have curved surfaces, spherical portions, or cylindrical surfaces. The cylindrical shape of Shielded Cabinet 54 is an example of such a non-planar surface. A flexible Magnetically-Attachable EMI Shielding Cover 16 can be used to cover Opening 56 despite the cylindrical shape of Shielded Cabinet 54.

The invention has been described in its presently contemplated best mode, and it is clear that it is susceptible to various modifications, modes of operation and embodiments, all within the ability and skill of those skilled in the art and without the exercise of further inventive activity. Accordingly, what is intended to be protected by Letters Patents is set forth in the appended claims.

What is claimed is:

1. For use in a system having cabinet shielding capable of ferro-magnetic attraction, an EMI shielding cover comprising:

a magnetic planar layer having a first face, and having a second face opposite to said first face which is capable of attracting ferro-magnetic objects;

an adhering layer disposed on the surface of said second face of said magnetic planar layer; and a conductive planar layer having first and second faces, said first face of said conductive planar layer adhered to said surface of said second face of said magnetic planar layer by way of said adhering layer, whereby said second face of said conductive planar layer is held over an opening in said shielding by said second face of said magnetic planar layer.

2. The EMI shielding cover as in claim 1, wherein said magnetic planar layer is flexible.

3. The EMI shielding cover as in claim 2, wherein said conductive planar layer is flexible.

4. The EMI shielding cover as in claim 3, wherein said conductive planar layer comprises electrically conductive foil.

5. The EMI shielding cover as in claim 3, wherein said conductive planar layer comprises electrically conductive cloth.

6. The EMI shielding cover as in claim 3, wherein said conductive planar layer comprises electrically conductive wire mesh.

7. For use in a system having a metal shielding enclosure, wherein the metal shielding enclosure has one or more holes, slots, or other apertures susceptible to EMI emanation, an EMI shielding cover comprising:

an electrically conductive planar sheet, having first and second faces, and having sufficient size to cover a selected one of said holes, slots, or other apertures;

a magnetic planar sheet, juxtaposed to said first face of said conductive planar sheet, whereby said magnetic planar sheet holds said second face of said conductive planar sheet over at least one of said holes, slots, or other apertures in said shielding enclosure.

8. The EMI shielding cover as in claim 7, wherein the dimensions of said conductive planar sheet and said magnetic planar sheet are substantially coextensive.

9. The EMI shielding cover as in claim 7, wherein said magnetic planar sheet is flexible.

10. The EMI shielding cover as in claim 9, wherein said conductive planar sheet is flexible.

11. The EMI shielding cover as in claim 10, wherein said conductive planar sheet consists of an electrically conductive web.

12. The EMI shielding cover as in claim 10, wherein said conductive planar sheet consists of a substantially non-porous electrically conductive material.

13. The EMI shielding cover as in claim 7, wherein said conductive planar sheet is formed onto said magnetic planar sheet by way of depositing.

14. The EMI shielding cover as in claim 7, wherein said magnetic planar sheet is permanently attached to said first face of said conductive planar sheet.

15. For use in a system having metal cabinet shielding, an EMI shielding cover comprising:

conductive means for covering one or more openings in said metal cabinet shielding, and for making at least some electrical contact with said metal cabinet shielding around said one or more openings; and magnetic means for holding said conductive means against said metal cabinet shielding.

16. The EMI shielding cover as in claim 15, further comprising adhesive means for attaching said magnetic means to said conductive means.

17. The EMI shielding cover as in claim 16, wherein said conductive means and said magnetic means are flexible.

18. A method of attenuating EMI emanation from an aperture in metal cabinet shielding, the method comprising the steps of:

covering the aperture with an electrically conductive material; and holding said electrically conductive material over the aperture with at least one magnetic element, wherein said magnetic element is oriented such that the magnetic attraction is towards said metal cabinet shielding.

19. The method as defined by claim 18, wherein said conductive material is located between said magnetic element and said metal cabinet shielding.

20. The method as defined by claim 18, wherein:

said electrically conductive material has a size sufficient to at least cover the aperture and to extend beyond the periphery of the aperture; and said magnetic element has a size sufficient to at least cover the aperture and to extend beyond the periphery of the aperture.

21. The method as defined by claim 20, further comprising the step of adhering said conductive material to said magnetic element to form one composite conductive element which can be attached to said metal cabinet shielding by a magnetic force.

22. The method as defined by claim 21, wherein said composite conductive element is flexible.

* * * * *